(12) United States Patent
Moon et al.

(10) Patent No.: US 11,003,020 B2
(45) Date of Patent: May 11, 2021

(54) LIGHT SOURCE PACKAGE, BACKLIGHT UNIT INCLUDING LIGHT SOURCE PACKAGE, AND DISPLAY DEVICE USING THE SAME

(71) Applicant: LG Display Co., Ltd., Seoul (KR)

(72) Inventors: JeYoung Moon, Goyang-si (KR); SangHo Han, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/391,539

(22) Filed: Apr. 23, 2019

(65) Prior Publication Data
US 2019/0324327 A1    Oct. 24, 2019

(30) Foreign Application Priority Data
Apr. 24, 2018 (KR) ........................ 10-2018-0047531

(51) Int. Cl.
| G02F 1/13357 | (2006.01) |
| H01L 25/13 | (2006.01) |
| H05K 1/18 | (2006.01) |
| H01L 33/62 | (2010.01) |
| G02F 1/1335 | (2006.01) |

(Continued)

(52) U.S. Cl.
CPC .. *G02F 1/133606* (2013.01); *G02F 1/133603* (2013.01); *H01L 25/13* (2013.01); *H01L 33/486* (2013.01); *H01L 33/507* (2013.01); *H05K 1/181* (2013.01); *G02F 1/133614* (2021.01); *H01L 33/62* (2013.01); *H01L 2933/0091* (2013.01); *H05K 2201/10106* (2013.01); *H05K 2201/10522* (2013.01)

(58) Field of Classification Search
None
See application file for complete search history.

(56) References Cited

U.S. PATENT DOCUMENTS

| 2008/0142822 A1 | 6/2008 | Kim et al. |
| 2010/0193806 A1 | 8/2010 | Byun |

(Continued)

FOREIGN PATENT DOCUMENTS

| EP | 2 492 577 A2 | 8/2012 |
| JP | 2007-173373 A | 7/2007 |

(Continued)

OTHER PUBLICATIONS

Extended European Search Report dated Jul. 2, 2019, issued in corresponding European Patent Application No. 19170748.8.

(Continued)

*Primary Examiner* — Ashok Patel
(74) *Attorney, Agent, or Firm* — Morgan, Lewis & Bockius LLP

(57) ABSTRACT

A light source package, a backlight unit, and a display device are provided. A light source package includes: a frame including a plurality of first grooves spaced apart from each other, a plurality of light sources, each in a respective one of the plurality of first grooves, a plurality of first diffuser layers respectively filling the plurality of first grooves and covering the plurality of light sources, and a second diffuser layer covering the plurality of first diffuser layers on the plurality of first grooves, wherein an uppermost end of the frame is higher than an upper surface of the second diffuser layer.

13 Claims, 12 Drawing Sheets

(51) Int. Cl.
*H01L 33/48* (2010.01)
*H01L 33/50* (2010.01)

(56) References Cited

U.S. PATENT DOCUMENTS

| | | | |
|---|---|---|---|
| 2011/0241033 A1 | 10/2011 | Nagai | |
| 2015/0098208 A1* | 4/2015 | Su | G02B 5/0236 |
| | | | 362/97.1 |
| 2017/0059129 A1 | 3/2017 | Li | |

FOREIGN PATENT DOCUMENTS

| | | |
|---|---|---|
| KR | 10-2010-0030805 A | 3/2010 |
| KR | 10-1064036 B1 | 9/2011 |

OTHER PUBLICATIONS

Office Action dated Feb. 16, 2021, issued in corresponding European Patent Application No. 19 170 748.8.

* cited by examiner

006
LIGHT SOURCE PACKAGE, BACKLIGHT UNIT INCLUDING LIGHT SOURCE PACKAGE, AND DISPLAY DEVICE USING THE SAME

CROSS-REFERENCE TO RELATED APPLICATION(S)

This application claims the benefit of and priority to Korean Patent Application No. 10-2018-0047531, filed on Apr. 24, 2018, the entirety of which is hereby incorporated by reference.

BACKGROUND

1. Technical Field

The present disclosure relates to a light source package, a backlight unit including a light source package, and a display device using the same, and more particularly, to a backlight unit including a light source package capable of implementing surface emission and a manufacturing method of a display device using the same.

2. Discussion of the Related Art

A liquid crystal display (LCD) has features such as light weight, thinness, and low power consumption so that an application range of the liquid crystal display is wide. The liquid crystal display displays images by adjusting a light transmittance of liquid crystals using an electric field. To this end, the liquid crystal display may display desired images on a screen by adjusting liquid crystals arranged in a matrix and a light transmittance in accordance with an image signal applied to a plurality of control switches. Because the liquid crystal display is not a self-emitting display device, a backlight unit that supplies light to a rear surface of a liquid crystal display panel, on which images are displayed, is equipped.

A backlight unit may be classified into a direct light type, which irradiates light onto a liquid crystal panel from a plurality of light source packages installed immediately below the liquid crystal display device, and an edge light type, which transmits light from a plurality of light source packages installed on a side wall of a light guide panel (LGP) to a liquid crystal panel.

SUMMARY

Accordingly, the present disclosure is directed to a light source package, a backlight unit including a light source package, and a display device using the same that substantially obviate one or more of the issues due to limitations and disadvantages of the related art.

An aspect of embodiments of the present disclosure is to provide a backlight unit including a light source package that uses a light source package capable of implementing surface emission to reduce a thickness of a backlight unit, and a display device using the same.

Another aspect of embodiments of the present disclosure is to provide a backlight unit including a light source package that improves a hot spot mura phenomenon in that a light source is visibly recognized to improve an image quality, and a display device using the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a light source package, including: a frame including a plurality of first grooves spaced apart from each other, a plurality of light sources, each in a respective one of the plurality of first grooves, a plurality of first diffuser layers respectively filling the plurality of first grooves and covering the plurality of light sources, and a second diffuser layer covering the plurality of first diffuser layers on the plurality of first grooves, wherein an uppermost end of the frame is higher than an upper surface of the second diffuser layer.

In another aspect, there is provided a backlight unit, including: a printed circuit board, and a plurality of surface light source packages mounted on the printed circuit board, each of the plurality of surface light source packages including: a plurality of point light sources, a frame including a plurality of first grooves in which the plurality of point light sources is accommodated, a first sealant filling the plurality of first grooves, and a second sealant filling a second groove on the plurality of first grooves, wherein a height from an upper surface of the printed circuit board to an upper surface of the second sealant is smaller than a height from the upper surface of the printed circuit board to an uppermost end of the frame.

In another aspect, there is provided a display device, including: a display panel, and a plurality of light source packages on a rear surface of the display panel, each of the plurality of light source packages including: a frame including a plurality of first grooves, a plurality of light sources respectively in the plurality of first grooves, a plurality of first diffuser layers respectively enclosing the plurality of light sources, and a second diffuser layer covering the plurality of first diffuser layers.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this disclosure, illustrate embodiments of the disclosure and together with the description serve to explain various principles of the disclosure.

Figure 1:
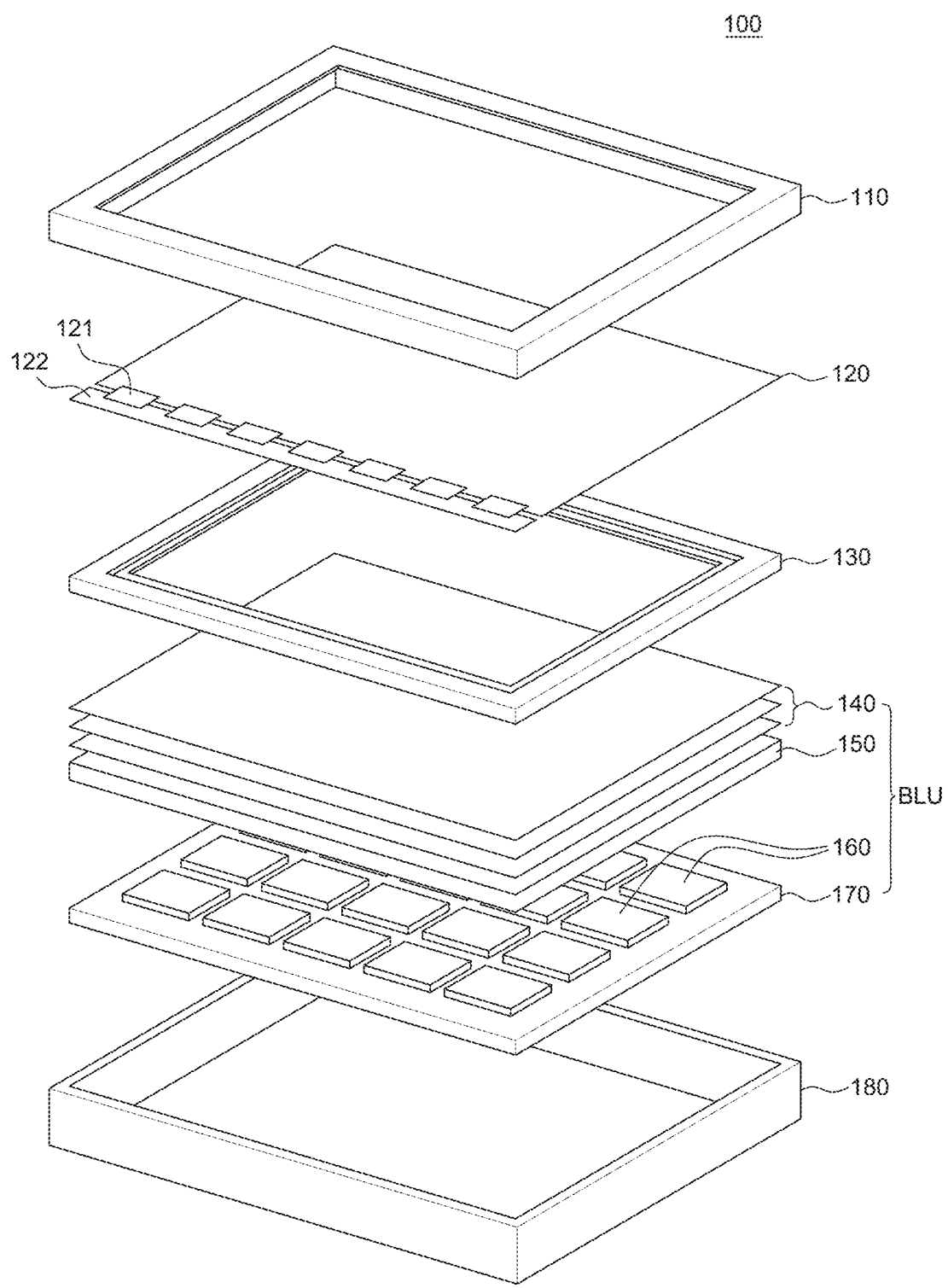
FIG. 1 is an exploded perspective view of a display device according to an example embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present disclosure are used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used.

In describing a time relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein.

Hereinafter, example embodiments of the present disclosure will be described in detail with reference to the accompanying drawings.

Figure 2:
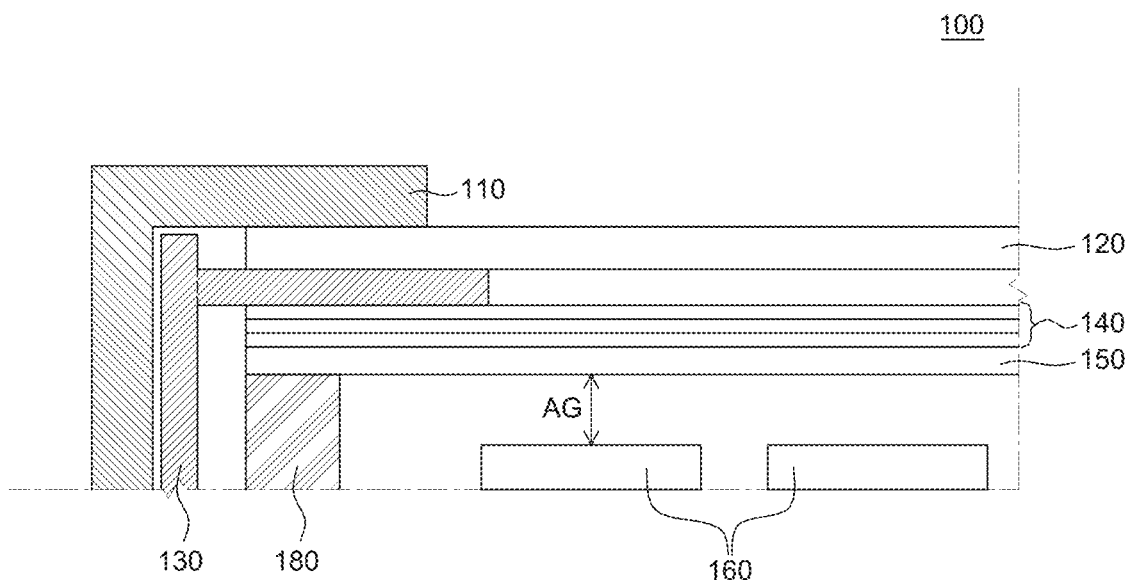
FIG. 2 is an enlarged cross-sectional view of a display device according to an example embodiment of the present disclosure.

FIG. 1 is an exploded perspective view of a display device according to an example embodiment of the present disclosure. FIG. 2 is an enlarged cross-sectional view of a display device according to an example embodiment of the present disclosure.

With reference to FIGS. 1 and 2, a display device 100 according to an example embodiment of the present disclosure may include a top case 110, a display panel 120, a guide panel 130, a backlight unit BLU, and a cover bottom 180. The top case 110 may protect the display panel 120 from the outside. The top case 110 may cover an upper edge of the display panel 120 and a side of the display panel 120. The top case 110 may include a horizontal portion and a vertical portion. The horizontal portion of the top case 110 may enclose the upper edge of the display panel 120. The vertical portion of the top case 110 may enclose the side of the display panel 120 enclosed by a guide panel 130. The top case 110 may include a plastic or a metal material having a strong strength to protect the display panel 120, but embodiments are not limited thereto.

The display panel 120 may be a panel that may display images. For example, the display panel 120 may be a liquid crystal display panel 120 that may adjust a light transmittance of liquid crystals to display images. The display panel 120 may include a lower substrate, a liquid crystal layer on the lower substrate, and an upper substrate on the liquid crystal layer.

In the lower substrate, a plurality of gate lines and data lines may intersect to define pixels. A thin film transistor may be provided at every intersection of pixels to be connected to a pixel electrode formed in each pixel.

A common electrode may form an electric field together with the pixel electrode to control the liquid crystals. In accordance with a liquid crystal alignment control method of the liquid crystal layer, the common electrode may be formed on the lower substrate or the upper substrate. For example, when the liquid crystal is controlled in a twisted nematic (TN) mode or a vertical alignment (VA) mode, the common electrode may be disposed on the upper substrate and the pixel electrode and the common electrode form a vertical electric field to control the liquid crystal. When the liquid crystal is controlled in a fringe field switching (FFS) mode or an in-plane switching (IPS) mode, the common electrode may be disposed on the lower substrate, and the pixel electrode and the common electrode may form a horizontal electric field to control the liquid crystals.

A color filter and a black matrix may be disposed on the upper substrate. Light emitted from the backlight unit BLU may pass through the liquid crystal layer and the color filter between the lower substrate and the upper substrate, and may be converted into various colored light. The black matrix may conceal the gate lines, the data lines, or the thin film transistors disposed on the lower substrate to not be visibly recognized. Further, although not illustrated in FIG. 1, a polarizer may be disposed on a front surface and a rear surface of the display panel 120.

A driver unit 122 may be disposed along one side of the display panel 120 to drive the display panel 120. The driver unit 122 may have the form of a long extended PCB. The driver unit 122 may include various ICs, such as a gate driver IC or a data driver IC and driving circuits. The driver unit 122 may apply a signal to the gate lines and the data lines to drive the display panel 120. In this case, the driver unit 122 may be electrically connected to the display panel 120 through a connection member 121. For example, the connection member 121 may be a chip-on-film (COF) or a tape carrier package (TCP).

The guide panel 130 may support the display panel 120 below the display panel 120. For example, the guide panel 130 may be formed as a rectangular frame to support the lower edge of the display panel 120. The guide panel 130 may include a vertical portion and a horizontal portion. The vertical portion of the guide panel 130 may enclose the side of the display panel 120, and/or may be in contact with the vertical portion of the top case 110. The horizontal portion of the guide panel 130 may protrude from the vertical portion to enclose or contact the lower edge of the display panel 120.

The backlight unit BLU may supply light to the display panel 120. The backlight unit BLU may include one or a plurality of optical sheets 140, a diffusion plate 150, a plurality of light source packages 160, and a printed circuit board 170. The backlight unit BLU may be a direct light type backlight unit BLU, and the plurality of light source packages 160 may be disposed below the display panel 120.

The direct light type backlight unit BLU may be configured such that the plurality of light source packages 160 may be directed to the display panel 120 so that more light sources than that of an edge light type backlight unit may be disposed. Further, in the direct light type backlight unit BLU, the plurality of light source packages 160 may be individually driven. Therefore, the direct light type backlight unit BLU may implement an excellent contrast ratio through local dimming driving. Further, the direct light type backlight unit BLU may implement a dynamic image with a high luminance through high dynamic range driving, which may increase a contrast ratio of a bright screen and a dark screen, by increasing a luminance of the light source package 160 corresponding to an area where a bright screen may be displayed.

The at least one or the plurality of optical sheets 140 may diffuse or condense light emitted from the plurality of light source packages 160 to allow light having a uniform surface shape to be incident onto the display panel 120. The one or the plurality of optical sheets 140 may include a diffusion sheet and at least one light condensing sheet.

The diffusion plate 150 may be disposed between the one or the plurality of optical sheets 140 and the plurality of light source packages 160. The diffusion plate 150 may diffuse light emitted from the plurality of light source packages 160 to allow the light to be incident onto the one or the plurality of optical sheets 140.

The one or the plurality of light source packages 160 may emit white light. The light emitted from the one or the plurality of light source packages 160 may pass through the diffusion plate 150 and the one or the plurality of optical sheets 140, and may be uniformly supplied onto the entire surface of the display panel 120. For example, the light source package 160 may serve as a surface emission light source package 160 to uniformly supply light to the front surface of the display panel 120. The light source package 160 will be described below in more detail with reference to FIGS. 3A and 3B.

The plurality of light source packages 160 may be mounted in the printed circuit board 170. The printed circuit board 170 may be electrically connected to the plurality of light source packages 160 to apply a voltage to the light source packages 160.

The cover bottom 180 may accommodate the backlight unit BLU. Further, the cover bottom 180 may radiate heat generated in the light source package 160 to the outside. In this case, a reflective sheet, which may reflect the light from the light source package 160 to the display panel 120, may be attached to a bottom surface of the cover bottom 180. Although not illustrated in FIG. 2, an adhesive tape, an adhesive material for attachment or a pad for absorbing a shock may be further disposed in one of the following positions: between the top case 110 and the display panel 120, between the display panel 120 and the guide panel 130, between the guide panel 130 and the optical sheet 140, and/or the diffusion plate 150 and the cover bottom 180.

Hereinafter, the light source package 160 will be described in more detail with reference to FIGS. 3A and 3B.

Figure 3A:
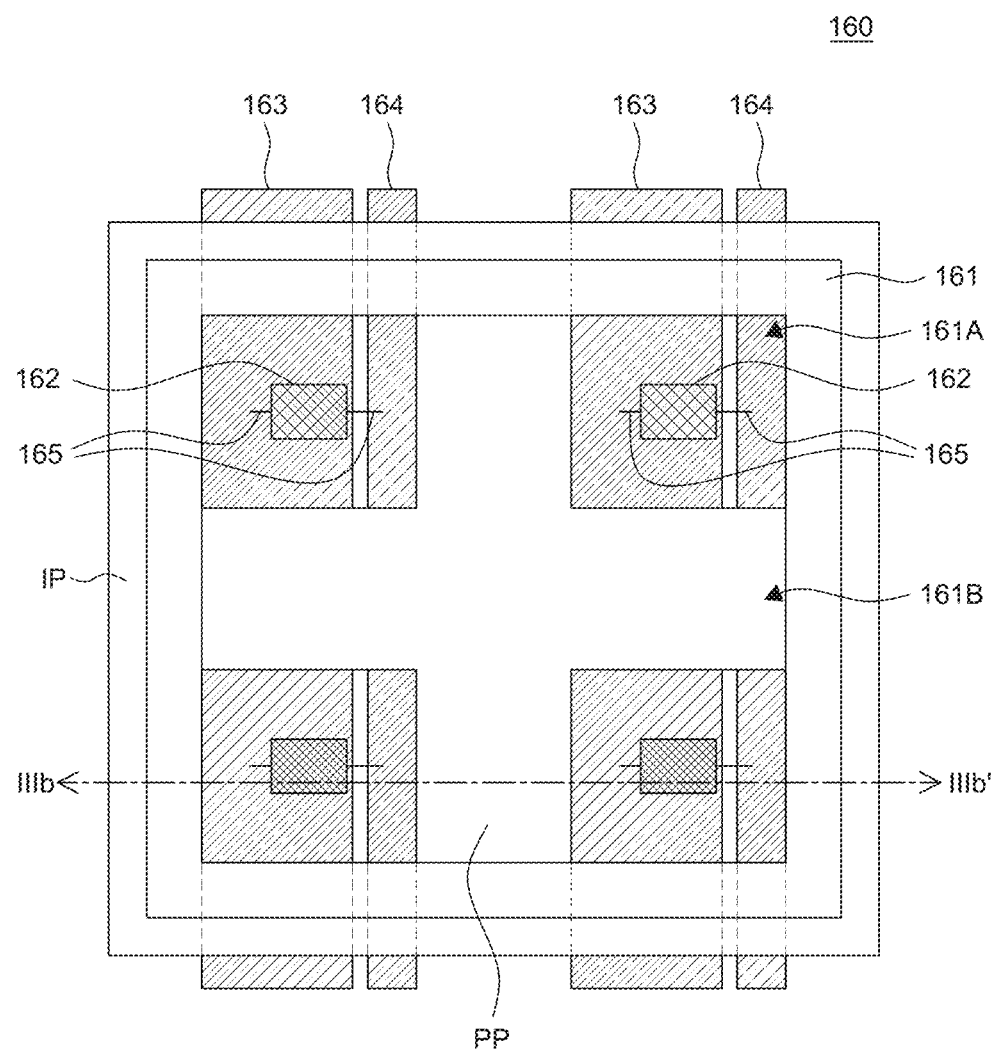
FIG. 3A is a plan view of a light source package according to an example embodiment of the present disclosure.

FIG. 3A is a plan view of a light source package according to an example embodiment of the present disclosure. FIG. 3B is a cross-sectional view taken along line IIIb-IIIb' of FIG. 3A.

For convenience of description, in FIG. 3A, a first diffuser layer 166, a phosphor 168, a second diffuser layer 167, and a plurality of beads 169 are omitted. With reference to FIGS. 3A and 3B, the light source package 160 of the display device 100 according to an example embodiment of the present disclosure may include a frame 161, a plurality of light sources 162, a plurality of first electrodes 163, a plurality of second electrodes 164, a wire 165, a first diffuser layer 166, a second diffuser layer 167, a phosphor 168, and a plurality of beads 169.

The light source package 160 may serve as a surface light source package 160. For example, point-shaped light emitted from the plurality of light sources 162 of the light source package 160 may be converted into surface-shaped light. The point-shaped light from the light source 162 of the light source package 160 may be converted into surface-shaped light to be uniformly supplied to the entire surface of the display panel 120 so that the hot spot mura phenomenon may be improved. In this case, in the present disclosure, the hot spot mura phenomenon may be defined as a phenomenon that point-shaped light emitted from the light source 162 is not uniformly diffused to the entire surface of the display panel 120, but is concentrated onto an upper center of the light source 162 so that a luminance of a region corresponding to the light source 162 in the display panel 120 is excessively increased and a luminance of the other area is low, which results in spots of the entire display panel 120.

The plurality of light sources 162 may be accommodated in the frame 161 so that the plurality of light sources 162 may form one light source package 160. The frame 161 may be formed of at least one of: a resin material, such as polyphthalamide (PPA), silicon (Si), a metal material, photo sensitive glass (PSG), and sapphire ($Al_2O_3$).

The frame 161 may include a plurality of first grooves 161A and a second groove 161B. The plurality of light sources 162, the plurality of first diffuser layers 166, and the second diffuser layers 167 may be disposed in the frame 161.

The plurality of first grooves 161A may be spaced apart from each other to be formed in the frame 161. The plurality of light sources 162 and the plurality of first diffuser layers 166 may be disposed in the plurality of first grooves 161A.

In this case, a protrusion PP may be disposed between the plurality of first grooves 161A. The protrusion PP may be disposed between the first groove 161A and the adjacent first groove 161A so that the plurality of first grooves 161A may be spaced apart from each other. Further, although it is illustrated in FIGS. 3A and 3B that the protrusion PP may be integrally formed with the frame 161, the protrusion PP may be formed to be separated from the frame 161 to be disposed in the frame 161, and embodiments are not limited thereto.

The second groove 161B of the frame 161 may be an opening area from top edge of the plurality of first grooves 161A to the uppermost end of the frame 161. The second groove 161B may be an area above the plurality of first grooves 161A. Further, the second diffuser layer 167 may be disposed in the second groove 161B.

In this case, the plurality of first grooves 161A and the second groove 161B may communicate with each other. However, the plurality of first grooves 161A may be filled with the plurality of first diffuser layers 166, and the second groove 161B may be filled with the second diffuser layer 167.

An inner side of the second groove 161B of the frame 161 may be formed to be an inclined plane IP. A lower base of the inclined plane IP may be disposed to be closer to the center of the frame 161 than an upper base of the inclined plane IP. Therefore, the second groove 161B formed in the frame 161 may have a shape that becomes wider from the bottom of the frame 161 toward an upper end of the frame 161 so that the frame 161 may have an inclined plane IP. Therefore, the second groove 161B has the largest area in the uppermost end of the frame 161. Further, when the second groove 161B has the largest area in the uppermost end of the frame 161, an upper surface of the second diffuser layer 167, which may fill the second groove 161B, may also have the largest area.

A final emission area and an optical extraction efficiency of the light source package 160 may be improved by the inclined plane (IP) without lowering the rigidity of the frame 161, which will be described below with reference to FIG. 3B. The frame 161 may have various shapes in accordance with the purpose and the design of the light source package 160. For example, a planar shape of the frame 161 may have various shapes, such as a circle or a triangle, as well as the rectangle, but embodiments are not limited thereto.

When the voltage is applied, the light source 162 may emit light. Each of the plurality of light sources 162 may be disposed in the plurality of first grooves 161A of the frame 161. For example, the light sources 162 may be a light-emitting diode (LED) that may emit light.

Figure 3B:
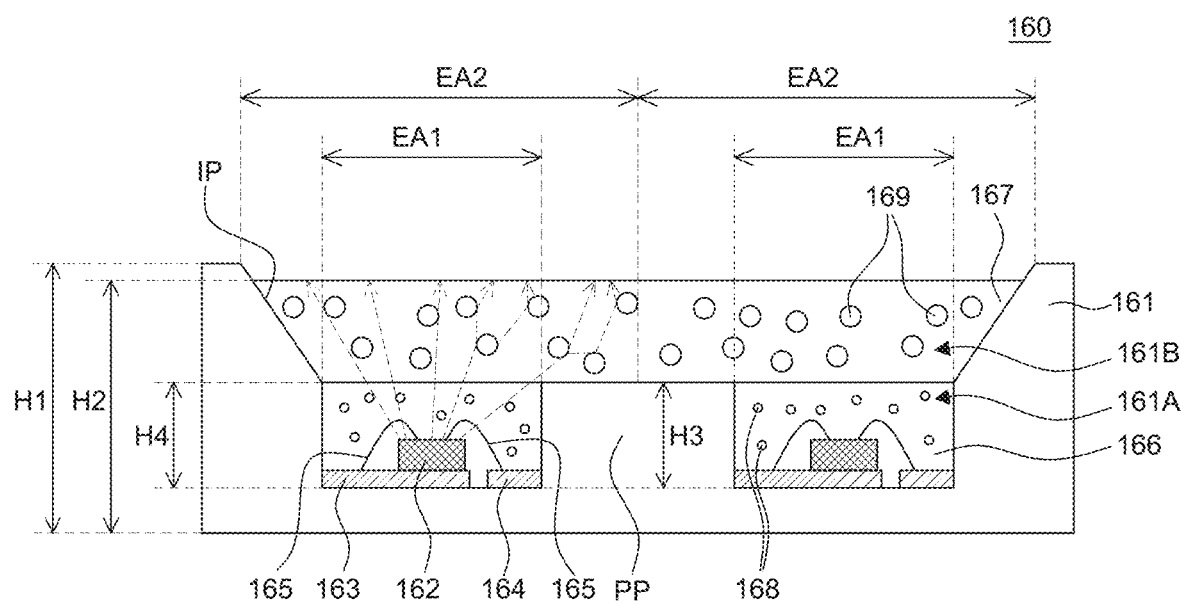
FIG. 3B is a cross-sectional view taken along line of FIG. 3A.

With reference to FIGS. 3A and 3B, the LED may be configured to have a lateral structure. A lateral LED may include a light-emitting layer and an N-type electrode and a P-type electrode, which may be horizontally disposed on both sides of the light-emitting layer. The lateral LED may emit light by coupling electrons supplied to the light-emitting layer through the N-type electrode and holes supplied to the light-emitting layer through the P-type electrode.

The light source 162, which may be a lateral LED, may be supplied with electrons and holes when the N-type electrode is connected to any one of the first electrode 163 and the second electrode 164, and the P-type electrode is connected to the other of the first electrode 163 and the second electrode 164, through the wires 165. However, the LED may be configured to have various structures, such as a vertical type or a flip chip, in addition to the lateral structure, but embodiments are not limited thereto.

For example, when the LED has a vertical structure, the vertical LED may include a light-emitting layer and an N-type electrode and a P-type electrode, which may be vertically disposed on and below the light-emitting layer. Similarly to the lateral LED, the vertical LED may also emit light when the electrons and holes supplied from the first electrode 163 and the second electrode 164 are coupled.

For example, when the LED has a flip chip structure, the flip chip LED may have the substantially same structure as the lateral LED. However, the flip chip LED may be configured such that the N-type electrode and the P-type electrode of the LED may be directly attached to the printed circuit board 170 without using a medium, such as wires 165, which may respectively connect the N-type electrode and the P-type electrode to the first electrode 163 and the second electrode 164. Hereinafter, for convenience of description, it may be presumed that the light source 162 in the light source package 160 is a lateral LED, but embodiments are not limited thereto.

Various colored light may be emitted from the light source 162, depending on the type of light source 162. For example, the light source 162 may include a red light source that may emit red light, a green light source that may emit green light, and a blue light source that may emit blue light.

For example, the red light source, which may emit red light, may include a compound semiconductor that may emit light having a wavelength range of 600 nm to 700 nm. The green light source, which may emit green light, may include a compound semiconductor that may emit light having a wavelength range of 500 nm to 600 nm. The blue light source, which may emit blue light, may include a compound semiconductor that may emit light having a wavelength range of 380 nm to 500 nm. Hereinafter, for convenience of description, it may be presumed that the plurality of light sources 162 of one light source package 160 is blue light sources, but embodiments are not limited thereto.

Although in it is illustrated FIGS. 3A and 3B that four light sources 162 may be disposed in one light source package 160, the number of light sources 162 disposed in one light source package 160 may vary depending on the design, and embodiments are not limited thereto.

The voltage may be applied to the light source 162 from the first electrode 163 and the second electrode 164. For example, the first electrode 163 and the second electrode 164 may be electrically connected to the light source 162 through the wires 165. The first electrode 163 and the second electrode 164 may be formed of a metal material having an excellent conductivity, such as copper or aluminum.

The first electrode 163 and the second electrode 164 may be spaced apart from each other to be disposed in the frame 161. For example, parts of the first electrode 163 and the second electrode 164 may be disposed on a bottom surface of the first groove 161A in the frame 161, and the light source 162 may be disposed on the first electrode 163. The remaining parts of the first electrode 163 and the second electrode 164 may penetrate the frame 161 to outwardly protrude from the frame 161. The remaining parts of the first electrode 163 and the second electrode 164, which may outwardly protrude from the frame 161, may be connected to the printed circuit board 170 to be supplied with the voltage.

The plurality of light sources 162 may not share the first electrode 163 and the second electrode 164, but the first electrode 163 and the second electrode 164 may be individually connected to one light source 162. For example, four light sources 162 may be disposed in the light source package 160, the first electrode 163 and the second electrode 164 may be connected to each of four light sources 162 so that four first electrodes 163 and four second electrodes 164 may be disposed. Therefore, the plurality of light sources 162 in one light source package 160 may be individually driven by the first electrode 163 and the second electrode 164, which may be separated from each other.

The plurality of first diffuser layers 166 may diffuse the light emitted from the plurality of light sources 162. The plurality of first diffuser layers 166 may be disposed to cover the light source 162 disposed in the plurality of first grooves 161A. The plurality of first diffuser layers 166 may be formed of translucent epoxy or silicon, but embodiments are not limited thereto.

The plurality of first diffuser layers 166 may fill the plurality of first grooves 161A, and may serve as a first sealant. The plurality of first diffuser layers 166 may physically protect the plurality of light sources 162. When the optional phosphors 168 are dispersed in the plurality of first diffuser layers 166, the plurality of first diffuser layers 166 may protect the phosphors 168 from the moisture.

The phosphors 168 may be dispersed in the plurality of first diffuser layers 166. The phosphors 168 may absorb light emitted from the light source 162 to emit light having a different wavelength. A particular type of phosphors 168 or several types of phosphors 168 may be dispersed in the plurality of first diffuser layers 166, depending on the color of light emitted from the light source 162. In this case, the combination of light emitted from the phosphor 168 and light emitted from the light source 162 may be white light.

For example, as described above, when the light source 162 emits blue light, the phosphor 168 may be formed of a green phosphor and a red phosphor. For example, the green phosphor may be a phosphor that may emit light having a wavelength range of 500 nm to 590 nm, and may be a complex phosphor that may be one or more of: $(SrBaMg)_2SiO_4{:}Eu$, $Al_5Lu_3O_{12}{:}Ce$, $(SrBaMg)_2SiO_4{:}Eu$, $A_3B_2Al_5O_{12}Cy$, $Y_3Al_5O_{12}{:}Ce$, $La_3Si_6N_{11}{:}Ce$, $(SrBaEu)_2SiO_4{:}Eu$, $\beta\text{-Sialon:}Si_6\text{-}zAlzOzN_8\text{-}z{:}Eu$, $Lu_3Al_5O_{12}{:}Ce$, $(Lu, Gd)_3Al_5O_{12}{:}Ce$, and $Y_3Al_5O_{12}{:}Ce$.

The red phosphor may be a phosphor that may emits light having a wavelength range of 590 nm to 700 nm, and may be a complex phosphor that may be one or more of: $(SrBaMg)_3SiO_5{:}Eu$, $(SrCa)AlSiN_3{:}Eu$, $CaAlSiN_3{:}Eu$, $MyM'z(Si,B,Al)_5OxN_8\text{-}x{:}Eu$, $MSi_1\text{-}zAlzOzN_2\text{-}z{:}Eu$, $\alpha\text{-Sialon:}CaxEuy(Si,Al)_{12}(O,N)_{16}$, S—$CaAlSiN$, $CaAlSiN$, and $(SrCa)AlSiN_3{:}Eu$, $K_2Si_{1-x}F_6{:}Mn_x$.

Although it is illustrated in FIG. 3B that the phosphors 168 may be dispersed in the plurality of first diffuser layers 166, the phosphors 168 may be dispersed only in the second diffuser layer 167 or may be dispersed in both the plurality of first diffuser layers 166 and the second diffuser layer 167, but embodiments are not limited thereto. Further, the type of the phosphor 168 may vary depending on the color of light emitted from the plurality of light sources 162. For example, as long as the combination of light emitted from the phosphor 168 and light emitted from the light source 162 is white light, the type of light source 162 and the type of the phosphor 168 may vary.

The second diffuser layer 167 may diffuse the light emitted from the plurality of light sources 162. For example, the second diffuser layer 167 may diffuse the light that may pass through the plurality of first diffuser layers 166, and may be primarily diffused to the entire surface of the light source package 160 and the entire second diffuser layer 167.

The upper surface of the second diffuser layer 167 may be disposed inside the frame 161, and may not outwardly protrude from the frame 161. The upper surface of the second diffuser layer 167 may be disposed in the second groove 161B.

For example, when a height from a bottom surface of the frame 161 to an uppermost end of the frame 161 is presumed as a first height H1, and a height from the bottom surface of the frame 161 to an upper surface of the second diffuser layer 167 is presumed as a second height H2, the first height H1 may be higher than the second height H2. Accordingly, the uppermost end of the frame 161 may be formed to be higher than the upper surface of the second diffuser layer 167. Additionally, the uppermost end of the frame 161 may be formed to be equal to the upper surface of the second diffuser layer 167.

When the upper surface of the second diffuser layer 167 protrudes toward the outside of the frame 161, for example, the outside of the second groove 161B, so that the second height H2 is higher than the first height H1, even when the upper surface of the second diffuser layer 167 has a flat shape, the second diffuser layer 167 may serve as a lens that may widen a beam angle of the light. Further, when the upper surface of the second diffuser layer 167 is designed to be higher than the uppermost end of the frame 161, it may be difficult to form the upper surface of the second diffuser layer 167 to be flat due to a surface tension, and the upper surface of the second diffuser layer 167 may be formed to have a convex shape to have the same shape as a lens. Therefore, when the upper surface of the second diffuser layer 167 outwardly protrudes from the frame 161, the second diffuser layer 167 may serve to widen the beam angle of the light of the light source package 160, which may result in a halo phenomenon that the light leakage is increased. Therefore, in the light source package 160 according to the example embodiment of the present disclosure, the upper surface of the second diffuser layer 167 may be formed to be equal to or lower than the uppermost end of the frame 161 so that the upper surface of the second diffuser layer 167 may not outwardly protrude from the frame 161. Therefore, the halo phenomenon may be prevented or decreased.

The second diffuser layer 167 may be disposed above the plurality of first diffuser layers 166 to cover the plurality of first diffuser layers 166. The upper surface of the second diffuser layer 167 may not be convex, but may be flat. For example, the center portion of the upper surface of the second diffuser layer 167 may be formed to be equal to the height of the edge of the upper surface of the second diffuser layer 167.

For example, when the upper surface of the second diffuser layer 167 is formed to be convex, the beam angle of the light emitted from the plurality of light sources 162 may be increased. Further, like local dimming driving or high dynamic range driving, when only some of the plurality of light source packages 160 is driven, light from the light source package 160 configured to have a wide beam angle may be diffused to another area. Therefore, when the upper surface of the second diffuser layer 167 is formed to be convex, for example, when the upper surface of the second diffuser layer 167 is formed to have a convex lens shape, the halo phenomenon that the light leakage is increased may occur so that the image quality may be deteriorated. Therefore, in the light source package 160 according to the example embodiment of the present disclosure, the upper surface of the second diffuser layer 167 may be formed to be flat, so that the effect of the halo phenomenon may be prevented or decreased without excessively widening the beam angle of the light.

The second diffuser layer 167 may be formed of translucent epoxy or silicon, but embodiments are not limited thereto. The second diffuser layer 167 may fill the second groove 161B of the frame 161, and may serve as a second sealant. The second diffuser layer 167 may physically protect the plurality of light sources 162, and may protect the phosphors 168 dispersed the second diffuser layer 167 or the phosphors 168 dispersed in the plurality of first diffuser layers 166 disposed below the second diffuser layer 167 from the moisture.

The beads 169 may be dispersed in the second diffuser layer 167. The beads 169 change a path of the light emitted from the plurality of light sources 162 to be directed to the display panel 120. For example, the beads 169 diffuse the light from the plurality of first diffuser layers 166 to the entire surface of the second diffuser layer 167. The beads 169 may change the path of light emitted from the plurality of light sources 162 and may be formed of a material having a refractive index higher than that of the second diffuser layer 167. For example, the beads 169 may have a regular shape or an irregular shape, a diameter thereof may be 1 μm to 40 μm and a refractive index thereof may be 1.2 to 2.5. Further, the beads 169 may be formed of polymethyl methacrylate (PMMA), polystyrene (PS), silicon, polybuthyl methacrylate (PBMA), titanium(II) oxide (TiO), or nylon, but embodiments are not limited thereto.

Although it is illustrated in FIG. 3B that the beads 169 may be dispersed in the second diffuser layer 167, the beads 169 may be dispersed only in the plurality of first diffuser layers 166 or dispersed in both the plurality of first diffuser layers 166 and the second diffuser layer 167, but embodiments are not limited thereto.

In the meantime, the point-shaped light emitted from the plurality of light sources 162 of the light source package 160 passes through the plurality of first diffuser layers 166 and is diffused to a primary emission area EA1. The primary emission area EA1 is an area where the light emitted from the plurality of light sources 162 is diffused by the plurality of first diffuser layers 166. The primary emission area EA1 overlaps the plurality of first diffuser layers 166 and the first groove 161A.

Next, the light diffused to the primary emission area EA1 may pass through the second diffuser layer 167 to be diffused to a secondary emission area EA2, and the emission area may be expanded. The secondary emission area EA2 may be an area where the light of the primary emission area EA1 may be diffused by the second diffuser layer 167. The secondary emission area EA2 may overlap the second groove 161B filled with the second diffuser layer 167. For example, the secondary emission area EA2 may overlap an area of the frame 161 open by the second groove 161B.

In this case, the inner side of the second groove 161B may be formed as an inclined plane IP, so that the frame 161 may have the largest opening area at the uppermost end of the second groove 161B and the uppermost end of the frame 161. Therefore, the secondary emission area EA2 may also be expanded by the inclined plane IP of the frame 161. Thus, the size of the final emission area of the light source package 160 may also be expanded.

However, to expand the secondary emission area EA2, when the inner side of the second groove 161B is formed to be vertical to the bottom surface of the frame 161, rather than the inclined plane IP, a part of the frame 161 that encloses the second groove 161B may have a small thickness. In this case, the second emission area EA2 overlapping the second groove 161B may be formed to be large, but a part of the frame 161 that encloses the second groove 161B may have a small thickness so that the rigidity of the frame 161 may be lowered. Therefore, in the light source package 160 according to the example embodiment of the present disclosure, an inner side of the second groove 161B may be formed as an inclined plane IP, so that not all the frame 161 has a small thickness, but only a part of the frame 161 has a small thickness. Therefore, the rigidity may be ensured as compared with a case in which the inner side of the frame 161 in the second groove 161B is formed to be vertical.

Further, among light diffused to the secondary emission area EA2 by the second diffuser layer 167, some light may be directed to the outside of the light source package 160. Further, the light emitted from the light source package 160 may need to be concentrated onto the upper portion of the light source package 160, but, due to some light which is directed to the outside of the light source package 160, the efficiency of the light source package 160 may be degraded. Therefore, in the light source package 160 according to the example embodiment of the present disclosure, some light directed to the outside of the light source package 160 may be reflected again to the upper portion of the light source package 160 by the inclined plane IP. Therefore, in the light source package 160 according to the example embodiment of the present disclosure, the inclined plane IP may be formed therein so that the optical extraction efficiency of the light source package 160 may be improved.

Further, the upper surface of the protrusion PP may be disposed to be equal or lower than the height of the lower base of the inclined plane IP. For example, when a height from the bottom surface of the first groove 161A to the upper surface of the protrusion PP is presumed as a third height H3 and a height from the bottom surface of the first groove 161A to the lower base of the inclined plane IP for example an inner side of the second groove 161B is presumed as a fourth height H4, the third height H3 may be equal to or smaller than the fourth height H4.

When the upper surface of the protrusion PP is disposed to be higher than the lower base of the inclined plane IP, the protrusion PP may be disposed even in the inside of the second diffuser layer 167 so that diffusion of the light in the second diffuser layer 167 may be interrupted. For example, when the protrusion PP protrudes into the second diffuser layer 167, the light from the plurality of first diffuser layers 166 that travels to the entire surface of the second diffuser layer 167 may be reflected by the protrusion PP or the traveling of the light may be interrupted. Therefore, it may be difficult to diffuse the light to the entire second diffuser layer 167.

Further, when the upper surface of the protrusion PP is disposed to be higher than the lower base of the inclined plane IP, some area of the second diffuser layer 167 overlapping the protrusion PP may have a smaller thickness than that of the remaining area of the second diffuser layer 167 that does not overlap the protrusion PP. Because some area of the second diffuser layer 167 has a smaller thickness than the remaining area, before the light is diffused to the entire second diffuser layer 167, the light may travel to the outside of the second diffuser layer 167. Therefore, in the light source package 160 according to the example embodiment of the present disclosure, the height from the bottom surface of the first groove 161A to the upper surface of the protrusion PP may be equal to or smaller than the height from the bottom surface of the first groove 161A to the lower base of the inclined plane IP so that the protrusion PP may not interrupt the diffusion of light in the second diffuser layer 167. Accordingly, in the light source package 160 according to the example embodiment of the present disclosure, the protrusion PP may be formed such that the plurality of first grooves 161A may be spaced apart from each other and the traveling of the light in the second diffuser layer 167 may not be interrupted. Therefore, the light may be uniformly diffused to the entire surface of the second diffuser layer 167, and surface-shaped light having uniform luminance may be implemented.

Therefore, the light emitted from the plurality of light sources 162 disposed in the light source package 160 may be diffused to the primary emission area EA1 in the first diffuser layer 166, and may be diffused to the secondary emission area EA2 in the second diffuser layer 167. Therefore, the light may be implemented as one surface-shaped light. Further, the path of the light diffused to the secondary emission area EA2 may be changed to the display panel 120 by the beads 169 dispersed in the second diffuser layer 167. Therefore, the plurality of first diffuser layers 166 and the second diffuser layer 167 may serve as a diffusion plate 150 and as a light guide panel that may cause the light emitted from the plurality of light sources 162 to travel to the entire surface of the light source package 160 to supply a uniform surface light source.

However, although it is illustrated in FIG. 3B that the primary emission area EA1 may overlap the first diffuser layer 166, the primary emission area EA1 may be further expanded from an area overlapping the first diffuser layer 166. Further, although it is illustrated in FIG. 3B that the secondary emission areas EA2 for adjacent light sources 162 in one light source package 160 may not overlap each other, depending on the example embodiments, the secondary emission areas EA2 for adjacent light sources 162 may overlap each other.

The point-shaped light emitted from the plurality of light sources 162 of the light source package 160 may pass through the plurality of first diffuser layers 166 and the second diffuser layer 167, and may be converted into the surface-shaped light. For example, the light source package 160 according to the example embodiment of the present disclosure may implement point-shaped light emitted from the plurality of light sources 162 by the surface-shaped light to serve as a surface light source package 160.

With reference to FIG. 2 again, the backlight unit BLU, including the light source package 160 according to the example embodiment of the present disclosure and a display device using the same, may reduce or minimize an air gap AG. The air gap AG is a separated space between the diffusion plate 150 and the light source package 160. When a predetermined value or higher of air gap AG is not ensured, the hot spot mura phenomenon may occur. For example, the smaller the air gap AG, the more the light emitted from the light source 162 may be concentrated into an upper center of the light source 162. Therefore, the hot spot mura phenomenon may occur. However, the light source package 160 according to the example embodiment of the present disclosure may convert point-shaped light into surface-shaped light to supply the surface-shaped light to the display panel 120. Therefore, even though the air gap GP may be small, the hot spot mura phenomenon may be reduced or minimized. Further, in the display device 100 including the light source package 160 according to the example embodiment of the present disclosure, the air gap AG may be reduced so that the thickness of the display device 100 may also be reduced. Hereinafter, the effect of reducing or minimizing the air gap AG and decreasing or preventing the hot spot mura phenomenon in the display device 100 according to the example embodiment of the present disclosure will be described in more detail with reference to FIGS. 4, 5A, and 5B.

Figure 4:
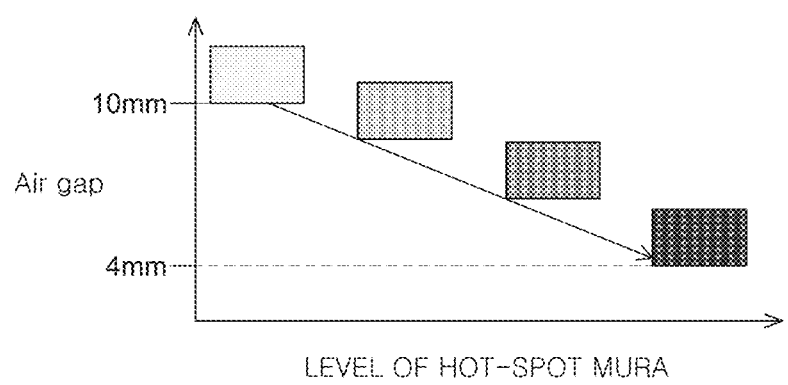
FIG. 4 is a graph of a hot spot mura level in accordance with an air gap in a display device according to a comparative example.
Figure 5A:
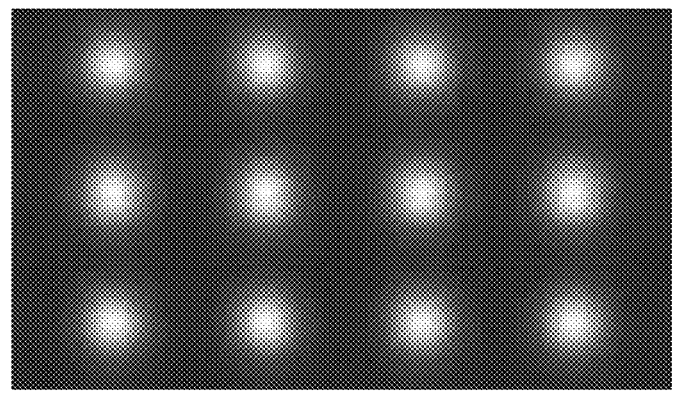
FIGS. 5A and 5B are views illustrating a light source package in a display device according to a comparative example and an example embodiment, respectively, when an air gap is 4 mm.
Figure 5B:
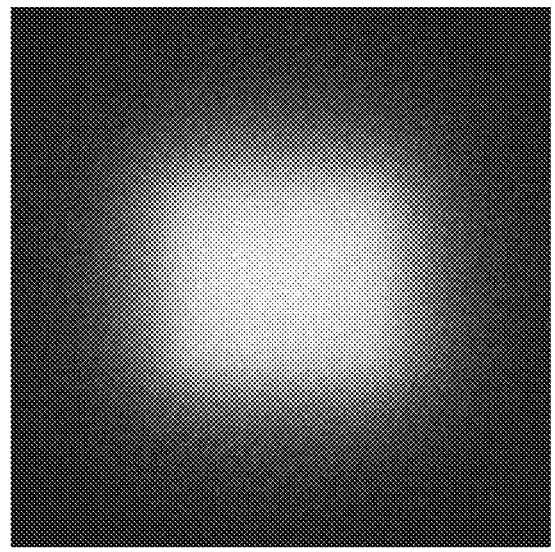

FIG. 4 is a graph of a hot spot mura level in accordance with an air gap in a display device according to a comparative example. FIGS. 5A and 5B are views illustrating a light source package in a display device according to a comparative example and an example embodiment, respectively, when an air gap is 4 mm.

A light source package according to the comparative example is a light source package in which the second diffuser layer 167 and the beads 169 are not disposed, as compared with the structure of the light source package 160 of the example embodiment of FIG. 3B. The light source package according to the example embodiment has a substantially similar structure as the light source package 160 of FIG. 3B.

With reference to FIG. 4, in the display device according to the comparative example, when the air gap AG is relatively small, the hot spot mura phenomenon in that the shape of point light source is visibly recognized becomes severe, as illustrated in FIG. 4. For example, with reference to FIG. 5A, when the air gap AG is set to be 4 mm in the display device according to the comparative example, the shapes of the light sources of the light source package are visibly recognized in the display device according to the comparative example.

For example, when the air gap AG is at least 10 mm, the point-shaped light source is not visibly recognized, and the point-shaped light source serves as a surface-shaped light source so that the hot spot mura phenomenon may be reduced. However, when the air gap AG is increased, the entire thickness of the display device is also increased so that the thickness of the direct light type backlight unit is increased. Therefore, there is a limitation in the slimming of the display device when the air gap is increased.

Therefore, the display device 100 according to the example embodiment of the present disclosure may convert the point-shaped light into the surface-shaped light to reduce the air gap AG and reduce the hot spot mura phenomenon. For example, the light source package 160 according to the example embodiment of the present disclosure may include a plurality of light sources 162 disposed in the frame 161, a plurality of first diffuser layers 166 that covers the plurality of light sources 162, and a second diffuser layer 167 that covers the plurality of first diffuser layers 166. Further, the light emitted as a point shape from the plurality of light sources 162 may pass through the plurality of first diffuser layers 166 to be diffused to the primary emission area EA1, and may pass through the second diffuser layer 167 to be diffused to the secondary emission area EA2 that may be wider than the primary emission area EA1. For example, the point-shaped light emitted from the plurality of light sources 162 may be converted into the surface-shaped light while passing through the plurality of first diffuser layers 166 and the second diffuser layer 167. The beads 169 dispersed in the second diffuser layer 167 may diffuse the light incident onto the second diffuser layer 167 to the entire surface of the second diffuser layer 167, and may change the path of the light to the rear surface of the light source package 160, for example, toward the display panel 120. Accordingly, the display device 100 according to the example embodiment of the present disclosure may convert point-shaped light emitted from the plurality of light sources 162 into surface-shaped light so that, even when the air gap AG is reduced, the effects of the hot spot mura phenomenon may be reduced. Further, because the air gap AG is reduced, the thickness of the backlight unit BLU may be reduced, and a display device 100 having a slim design may be implemented. For example, with reference to FIG. 5B, even when the air gap AG is set to be 4 mm in the display device according to the example embodiment, the shapes of the light sources 162 of the light source package 160 may not be visibly recognized.

Further, the display device 100 according to the example embodiment of the present disclosure may decrease the halo phenomenon occurring during the local dimming driving or high dynamic range driving to improve the image quality. According to the local dimming driving and the high dynamic range driving, only some light source packages 160 among the plurality of light source packages 160 may be driven, or some light source packages 160 may be driven at a high luminance so that light leakage problem, which is the halo phenomenon, may occur. In this case, the larger the beam angle of the light emitted from the plurality of light sources 162 of the light source package 160, the more the light from some light source packages 160 may be diffused to other areas, which may result in the halo phenomenon. Therefore, the light source package 160 according to the example embodiment of the present disclosure may include a plurality of light sources 162 disposed in the frame 161, a plurality of first diffuser layers 166 covering the plurality of light sources 162, and a second diffuser layer 167 covering the plurality of first diffuser layers 166. Further, the upper surface of the second diffuser layer 167 may not be convex, but may be formed to be flat. When the upper surface of the second diffuser layer 167 is formed to be flat, the beam angle of the light emitted from the plurality of light sources 162 of the light source package 160 may not be excessively increased. Therefore, in the light source package 160 according to the example embodiment of the present disclosure, the upper surface of the second diffuser layer 167 may be formed to be flat. Therefore, instead of a function as a lens that widens the beam angle of the light, the second diffuser layer 167 may perform the function of light guide and diffusion to convert the point-shaped light emitted from the light source 162 into the surface-shaped light.

Further, the second diffuser layer 167 may be formed to be lower than the uppermost end of the frame 161. The second diffuser layer 167 may be disposed in the second groove 161B of the frame 161 to not outwardly protrude from the frame 161. If the height from the bottom surface of the frame 161 to the upper surface of the second diffuser layer 167 is higher than the height from the bottom surface of the frame 161 to the uppermost end of the frame 161, so that the second diffuser layer 167 outwardly protrudes from the frame 161, even if the upper surface of the second diffuser layer 167 has a flat shape, the second diffuser layer 167 may serve as a lens that widens the beam angle of the light, which may result in the halo phenomenon. Further, when the upper surface of the second diffuser layer 167 is designed to outwardly protrude from the frame 161, it may be difficult to form the upper surface of the second diffuser layer 167 to be flat due to a surface tension, and the upper surface of the second diffuser layer 167 may be formed to be convex. Therefore, the light source package 160 according to the example embodiment of the present disclosure may be designed such that the upper surface of the second diffuser layer 167 may be formed to be lower than the uppermost end of the frame 161. Therefore, a possibility that the upper surface of the second diffuser layer 167 is formed to be convex may be reduced or minimized. Therefore, in the light source package 160 according to the example embodiment of the present disclosure, the upper surface of the second diffuser layer 167 may be formed to be flat, and may be formed to be lower than the uppermost end of the frame 161. Therefore, the halo phenomenon may be reduced without excessively widening the beam angle of the light in the light source package 160 to display a high quality image.

Figure 6:
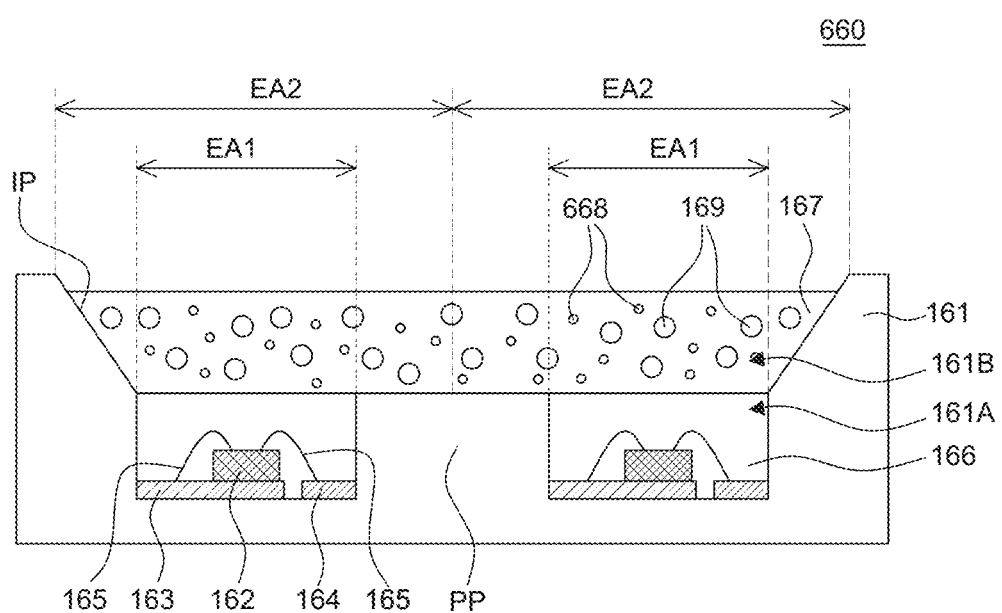
FIG. 6 is a cross-sectional view of a light source package according to another example embodiment of the present disclosure.

FIG. 6 is a cross-sectional view of a light source package according to another example embodiment of the present disclosure.

A light source package 660 illustrated in FIG. 6 is substantially similar to the light source package 160 illustrated in FIGS. 1 to 3B, except for the arrangement of the phosphor 668, and a redundant description will be omitted. With reference to FIG. 6, in the light source package 660 according to another example embodiment of the present disclosure, the phosphors 668 may be dispersed in the second diffuser layer 167. The phosphors 668 may absorb light emitted from the plurality of light sources 162 to emit light having a different wavelength. White light may be implemented by light emitted from the plurality of light sources 162 and light emitted from the phosphors 668.

Light emitted from the plurality of light sources 162 disposed in a plurality of first grooves 161A of the frame 161 may pass through the plurality of first diffuser layers 166, and may be diffused to the primary emission area EA1. Next, the light diffused to the primary emission area EA1 may pass through the second diffuser layer 167, and may be diffused to the secondary emission area EA2. The phosphors 668 dispersed in the second diffuser layer 167 may absorb light diffused to the secondary emission area EA2. For example, the phosphors 668 dispersed in the second diffuser layer 167 may absorb light diffused to the entire surface of the second diffuser layer 167 to emit light having different wavelengths.

In the light source package 660 according to another example embodiment of the present disclosure, the phosphors 668 may be dispersed in the second diffuser layer 167. Light emitted from the plurality of light sources 162 of the light source package 660 may pass through the plurality of first diffuser layers 166 and the second diffuser layer 167, and may be diffused to the entire surface of the light source package 660. The phosphors 668 dispersed in the second diffuser layer 167 may absorb the light emitted from the light source 162 to emit light having different wavelengths. In the light source package 660, white light may be implemented by light emitted from the plurality of light sources 162 and light emitted from the phosphors 668, and may be supplied to the display panel 120. Therefore, even when the phosphors 668 are dispersed in the second diffuser layer 167, the light emitted from the plurality of light sources 162 may be diffused to the entire second diffuser layer 167. Therefore, the phosphors 668 in the second diffuser layer 167 may absorb light of the light source 162 to emit light having different wavelengths. Therefore, the light source package 660 according to another example embodiment of the present disclosure may supply the white light to the display panel 120 without being limited to the dispersion position of the phosphors 668 so that a degree of freedom of design of the light source package 660 may be increased.

Figure 7A:
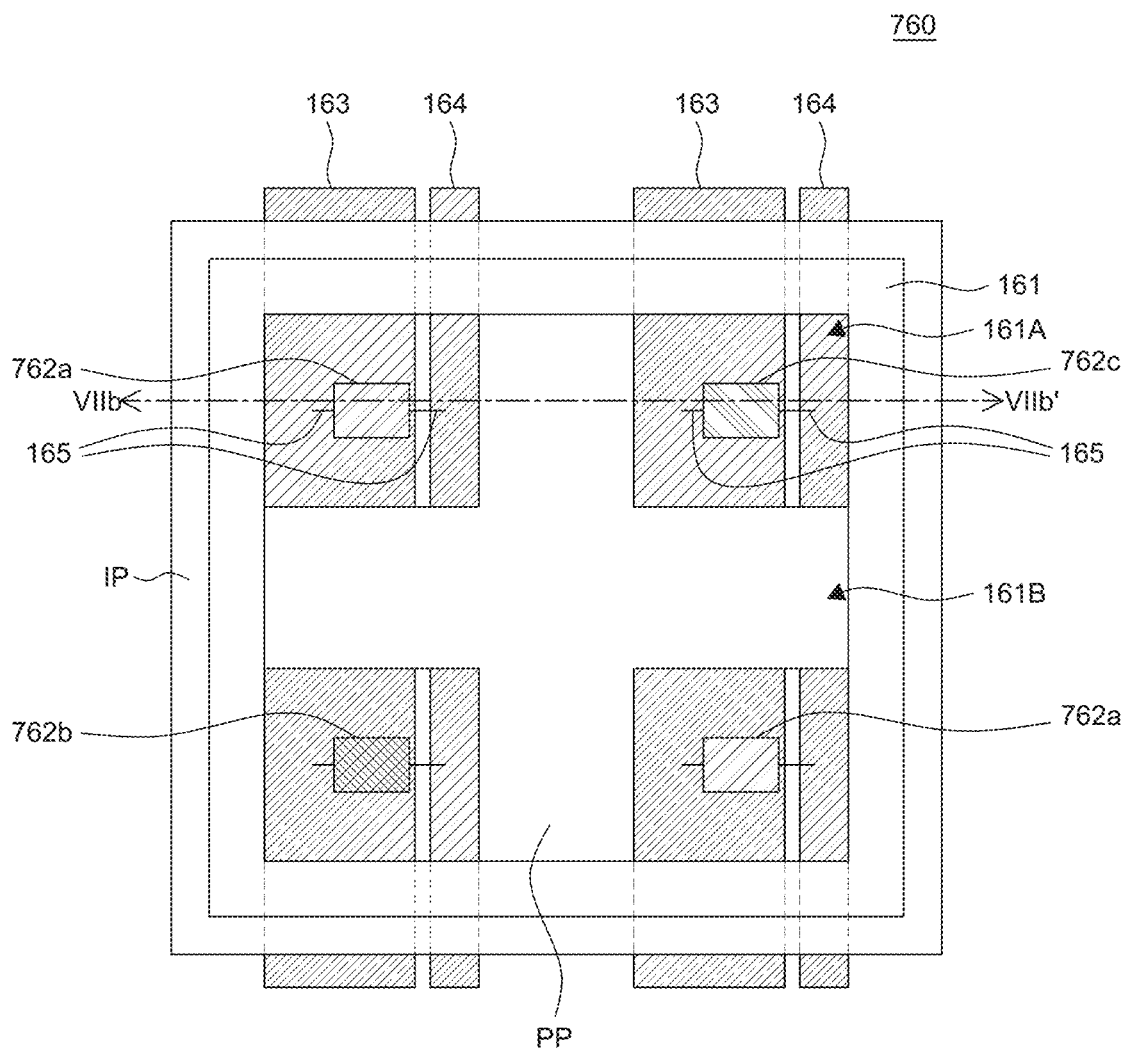
FIG. 7A is a plan view of a light source package according to still another example embodiment of the present disclosure.
Figure 7B:
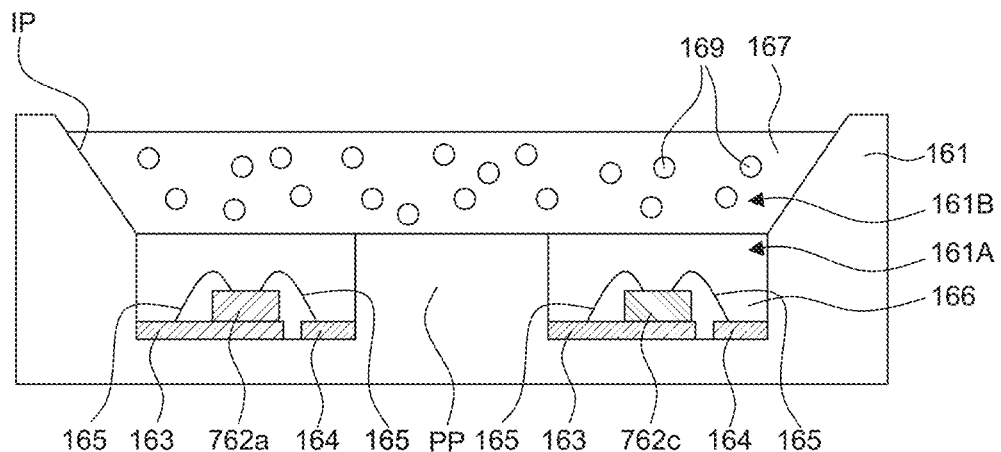
FIG. 7B is a cross-sectional view taken along line VIIb-VIIb' of FIG. 7A.

FIG. 7A is a plan view of a light source package according to still another example embodiment of the present disclosure. FIG. 7B is a cross-sectional view taken along line VIIb-VIIb' of FIG. 7A.

A light source package 760 illustrated in FIGS. 7A and 7B is substantially similar to the light source package 160 illustrated in FIGS. 1 to 3B, except for the light source, and a redundant description will be omitted.

With reference to FIG. 7A, a light source package 760 according to still another example embodiment of the present disclosure may include light sources 762a, 762b, and 762c which may emit different colored light disposed therein. For example, a plurality of light sources 762a, 762b, and 762c may be disposed in the light source package 760. The plurality of light sources 762a, 762b, and 762c may include a first light source 762a that may emit first color light, a second light source 762b that may emit second color light, and a third light source 762c that may emit third color light. Further, the combination of light emitted from the plurality of light sources 762a, 762b, and 762c disposed in the light source package 760 may be white light.

For example, one of the first light source 762a to third light source 762c may be a red light source, which may include a compound semiconductor emitting red light in a wavelength range of 600 nm to 700 nm. Another light source among the first light source 762a to third light source 762c may be a green light source, which may include a compound semiconductor emitting green light in a wavelength range of 500 nm to 600 nm. The other light source among the first light source 762a to third light source 762c may be a blue light source, which may include a compound semiconductor emitting blue light in a wavelength range of 380 nm to 500 nm.

In the meantime, a ratio of the first light source 762a, the second light source 762b, and the third light source 762c may be designed based on the efficiency of a particular light source 762a, 762b, and 762c in the light source package 760 to implement the white light. For example, when the efficiency of the first light source 762a is not better than the efficiency of the second light source 762b and the third light source 762c, two first light sources 762a, one second light source 762b, and one third light source 762c may be disposed in one light source package 760 to implement the white light.

Further, although it is illustrated in FIG. 7A that four light sources may be disposed in one light source package 760, the number of light sources in the light source package 760 may vary depending on the design. For example, six light sources may be disposed in one light source package 760, and two first light sources 762a, two second light sources 762b, and two third light sources 762c may be provided.

Further, in the backlight unit BLU formed of a plurality of light source packages 760, a ratio of all the plurality of light sources 762a, 762b, and 762c disposed in each of the plurality of light source packages 760 may be designed. For example, in some light source packages 760 among the plurality of light source packages 760, the first light sources 762a may be provided more than the second light source 762b and the third light source 762c. Further, in some light source packages 760, the second light sources 762b may be provided more than the first light source 762a and the third light source 762c. In the remaining light source packages 760, the third light sources 762c may be provided more than the first light source 762a and the second light source 762b. Therefore, even though each of the plurality of light source packages 760 in the backlight unit BLU may implement white light close to a particular color, the white light may be implemented in the whole area of the backlight unit BLU.

With reference to FIG. 7B, in the light source package 760 according to still another example embodiment of the present disclosure, the phosphors 168 and 668 may not be provided. If only one type of light source that emits the same color light is disposed in one light source package 760, the phosphors 168 and 668 may be disposed to implement white light. However, in the light source package 760 according to still another example embodiment of the present disclosure, light sources 762a, 762b, and 762c, which may emit different colored light, may be provided to implement the white light.

For example, light emitted from the first light source 762a in one light source package 760 may pass through the first diffuser layer 166 and the second diffuser layer 167, and may be diffused to the entire surface of the second diffuser layer 167. Similarly, light emitted from the second light source 762b and the light emitted from the third light source 762c may also pass through the first diffuser layer 166 and the second diffuser layer 167, and may be diffused to the entire surface of the second diffuser layer 167. Therefore, in the light source package 760, the light of the first light source 762a, the light of the second light source 762b, and the light of the third light source 762c, which may be uniformly diffused to the second diffuser layer 167, may be mixed to implement the white light.

The first light source 762a, the second light source 762b, and the third light source 762c, which may emit different colored light, may be disposed in the light source package 760 according to still another example embodiment of the present disclosure to implement the white light. In this case, the light source package 760 may include the plurality of light sources 762a, 762b, and 762c, which may emit different colored light, for example, a blue light source, a green light source, and a red light source, so that high color reproduction may be allowed. A high color reproduction effect will be described in more detail with reference to FIG. 8.

Figure 8:
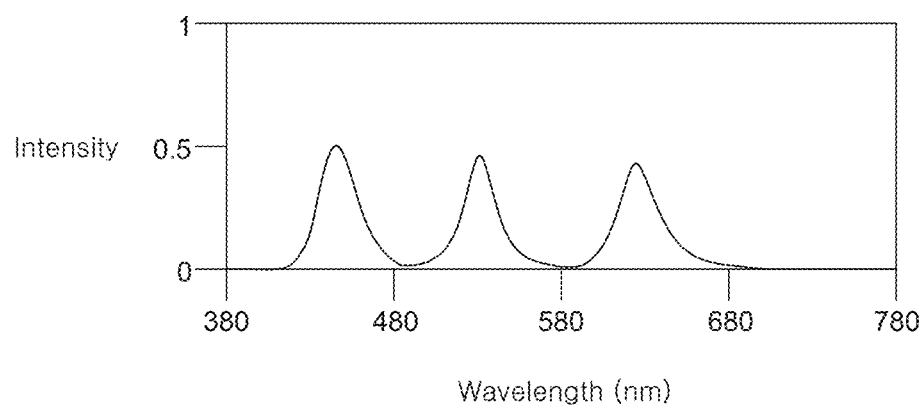
FIG. 8 is a graph obtained by measuring an intensity for every wavelength of light emitted from a light source package according to still another example embodiment of the present disclosure.

FIG. 8 is a graph obtained by measuring an intensity for every wavelength of light emitted from a light source package according to still another example embodiment of the present disclosure.

In FIG. 8, a horizontal axis represents a wavelength of light emitted from the light source package 760 illustrated in FIGS. 7A and 7B, and a vertical axis represents a relative intensity of light. With reference to FIG. 8, as a result of measuring light emitted from the light source package 760, the light may have a peak at approximately 450 nm in a wavelength range of 380 nm to 500 nm, which is a wavelength range of blue light. Further, the light may have a peak at approximately 520 nm in a wavelength range of 500 nm to 600 nm, which is a wavelength range of green light. Moreover, the light may have a peak at approximately 620 nm in a wavelength range of 600 nm to 700 nm, which is a wavelength range of red light. In this case, the intensity of blue light at 450 nm, the intensity of green light at 520 nm, and the intensity of red light at 620 nm are similar. Therefore, white light having a high purity may be implemented from the combination of light emitted from the first light source 762a, the second light source 762b, and the third light source 762c of one light source package 760.

For example, only when a plurality of light sources, which emits a particular-colored light, is disposed in the light source package 760, a peak may be high only in a wavelength range of a specific color, and a peak may be low in a wavelength range of another color. In this case, the white light implemented in the light source package 760 may be white light having a low purity, which is close to a particular color.

Therefore, the first light source 762a, the second light source 762b, and the third light source 762c, which emit different colored light, are used to be mixed in the light source package 760 according to still another example embodiment of the present disclosure so that white light having a high purity may be implemented, and an image close to a natural color may be implemented in the display panel 120.

Figure 9:
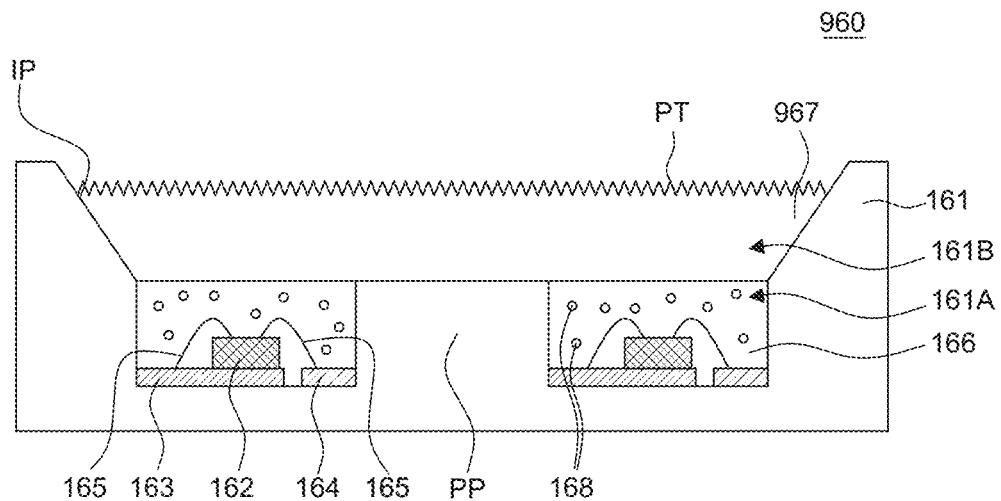
FIG. 9 is a cross-sectional view of a light source package according to still another example embodiment of the present disclosure.

FIG. 9 is a cross-sectional view of a light source package according to still another example embodiment of the present disclosure.

A light source package 960 illustrated in FIG. 9 is substantially similar to the light source package 160 illustrated in FIGS. 1 to 3B, except that a plurality of patterns PT is formed in a second diffuser layer 967 instead of the beads 169, and a redundant description will be omitted. The plurality of patterns PT may be implemented in all other embodiments of the invention. The pattern may be also used in combination with an embodiment in which the beads 169 are required. With reference to FIG. 9, a plurality of patterns PT may be formed on an upper surface of a second diffuser layer 967. The plurality of patterns PT may change a path of light emitted from a plurality of light sources 162 of a light source package 960 to be directed to the display panel 120.

Although it is illustrated in FIG. 9 that the plurality of patterns PT may have a saw-tooth pattern, the plurality of patterns PT of the upper surface of the second diffuser layer 967 may have a convex-concave structure or a sine wave structure. Embodiments are not limited to these examples.

Light emitted from the plurality of light sources 162 of the light source package 960 may pass through the plurality of first diffuser layer 166s and the second diffuser layer 967 to travel toward the display panel 120 outside the second diffuser layer 967. Some of light traveling to the upper surface of the second diffuser layer 967 may be incident at an incident angle for example larger than a critical angle to be totally reflected. If the upper surface of the second diffuser layer 967 is flat, the light incident at an incident angle for example larger than a critical angle may be totally reflected to travel in the second diffuser layer 967 again. Thus, there may be light for example not extracted to the outside of the light source package 960.

Therefore, the light source package 960 according to still another example embodiment of the present disclosure may include a plurality of patterns PT on the upper surface of the second diffuser layer 967 to reduce the total reflection generated in the light source package 960, and to improve the optical extraction efficiency. For example, to supply light emitted from the plurality of light sources 162 of the light source package 960 to the display panel 120, the light from the light sources 162 may need to pass through the plurality of first diffuser layers 166 and the second diffuser layer 967 to travel outside the second diffuser layer 967. In this case, the plurality of patterns PT may be formed on the upper surface of the second diffuser layer 967 to reduce the total reflection by scattering the light incident onto the upper surface of the second diffuser layer 967, and to improve the optical extraction efficiency from the second diffuser layer 967. Therefore, the light source package 960 according to still another example embodiment of the present disclosure may include a plurality of patterns PT on the upper surface of the second diffuser layer 967 to improve the optical efficiency of the light source package 960. Therefore, it may be possible to reduce power consumption and improve efficiency of the backlight unit BLU and the display device 100.

Figure 10:
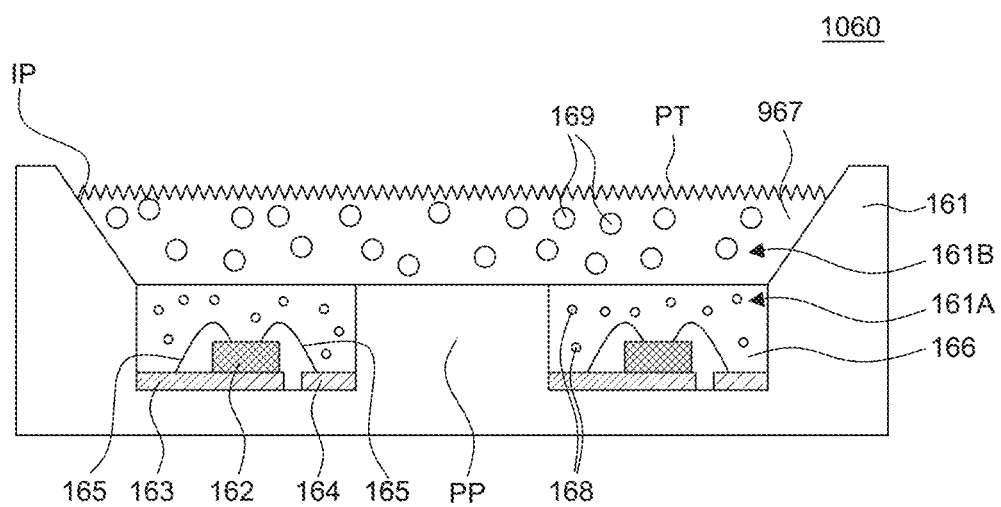
FIG. 10 is a cross-sectional view of a light source package according to still another example embodiment of the present disclosure.

FIG. 10 is a cross-sectional view of a light source package according to still another example embodiment of the present disclosure.

The light source package 1060 of FIG. 10 is substantially similar to the light source package 960 illustrated in FIG. 9, except that beads 169 are further included, and a redundant description will be omitted. With reference to FIG. 10, the light source package 1060 according to still another example embodiment of the present disclosure may further include beads 169 that may be dispersed in the second diffuser layer 967.

The beads 169 may change a path of the light emitted from the plurality of light sources 162 to be directed to the display panel 120. The beads 169 may diffuse the light from the plurality of first diffuser layers 166 to the entire surface of the second diffuser layer 967. The plurality of patterns PT disposed on the upper surface of the second diffuser layer 967 may change the path such that the light diffused to the entire surface of the second diffuser layer 967 from the beads 169 may travel to the outside of the second diffuser layer 967.

In the light source package 1060 according to still another example embodiment of the present disclosure, the beads 169 may be further dispersed in the second diffuser layer 967 with the plurality of patterns PT disposed on the upper surface thereof to improve the optical extraction efficiency of the light source package 1060. For example, the point-shaped light emitted from the plurality of light sources 162 may be diffused to the entire surface of the light source package 1060 from the plurality of first diffuser layers 166 and the second diffuser layer 967 to be converted into surface-shaped light. In this case, the beads 169 disposed in the second diffuser layer 967 may diffuse the light emitted from the plurality of light sources 162 to the entire second diffuser layer 967, and may change the path of the light toward the upper surface of the second diffuser layer 967, for example, to be directed to the display panel 120. Further, the light, which may be diffused to the entire surface of the second diffuser layer 967 by the beads 169 to be incident onto the upper surface of the second diffuser layer 967, may be scattered by the plurality of patterns PT on the upper surface of the second diffuser layer 967. The plurality of patterns PT on the upper surface of the second diffuser layer 967 may scatter the light to reduce the total reflection, and to improve the optical extraction efficiency. Therefore, in the light source package 1060 according to still another example embodiment of the present disclosure, the plurality of patterns PT may be disposed on the upper surface of the second diffuser layer 967, and the beads 169 may be dispersed in the second diffuser layer 967. Therefore, the point-shaped light emitted from the light source 162 of the light source package 1060 may be converted into surface-shaped light, the optical extraction efficiency may be improved, the power consumption may be reduced, and the efficiency of the backlight unit BLU and the display device 100 may be improved.

Figure 11:
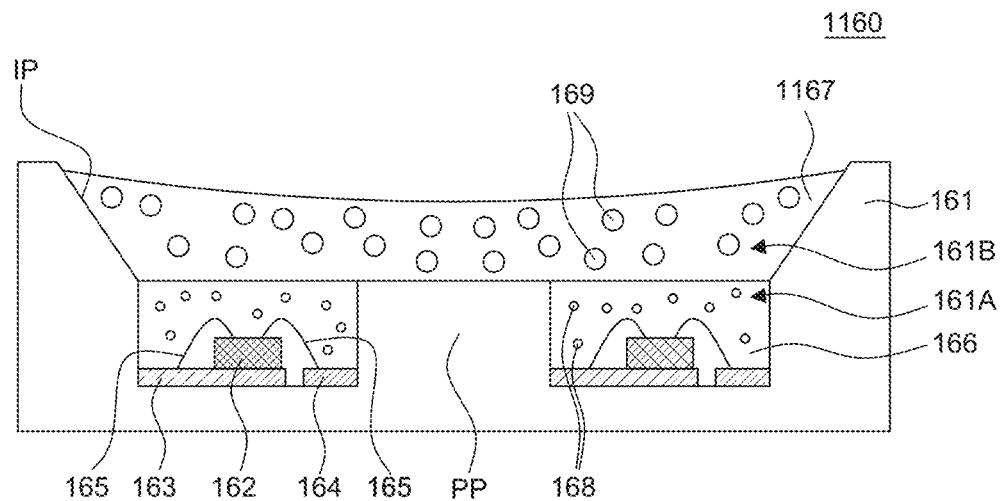
FIG. 11 is a cross-sectional view of a light source package according to still another example embodiment of the present disclosure.

FIG. 11 is a cross-sectional view of a light source package according to still another example embodiment of the present disclosure.

A light source package 1160 illustrated in FIG. 11 is substantially similar to the light source package 160 illustrated in FIGS. 1 to 3B, except for an upper surface of a second diffuser layer 1167, and a redundant description will be omitted. With reference to FIG. 11, in the light source package 1160 according to still another example embodiment of the present disclosure, an upper surface of a second diffuser layer 1167 may be formed to be concave. When the upper surface of the second diffuser layer 1167 is formed to be concave, a beam angle of the light emitted from the plurality of light sources 162 of the light source package 1160 may not be excessively increased.

Therefore, the light source package 1160 according to still another example embodiment of the present disclosure may form the upper surface of the second diffuser layer 1167 to be concave so that the halo phenomenon, in which that the light leakage is increased, may be reduced or minimized. For example, when the beam angle of the light emitted from the plurality of light sources 162 of the light source package 1160 is wide, the light may be diffused even to the peripheral area, in addition to an area in which the light may be actually necessary so that the halo phenomenon may occur. For example, during the local dimming driving or high dynamic range driving, which may drive only some light source packages 1160 among the plurality of light source packages 1160 in the direct light type backlight unit BLU to display a high quality image, the halo phenomenon may easily occur. In this case, the upper surface of the second diffuser layer 1167 of the light source package 1160 may be formed to be concave to reduce the beam angle of the light emitted from the light source package 1160, and to reduce, minimize, or prevent the halo phenomenon. Accordingly, in the light source package 1160 according to still another example embodiment of the present disclosure, the second diffuser layer 1167 may have a concave upper surface so that the beam angle of the light emitted from the light source package 1160 may be reduced to improve the halo phenomenon and to improve the image quality, thereby displaying a high quality image. The concave upper surface of the upper surface may be also implemented in other embodiments to further improve the light extraction.

Figure 12:
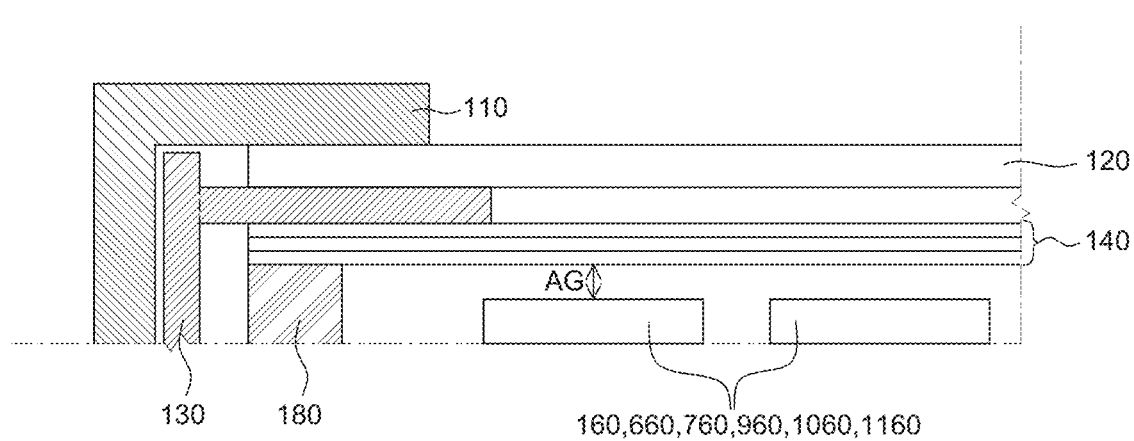
FIG. 12 is an enlarged cross-sectional view of a display device according to still another example embodiment of the present disclosure.

FIG. 12 is an enlarged cross-sectional view of a display device according to still another example embodiment of the present disclosure.

In FIG. 12 a display device 1200 may include any of the light source packages 160, 660, 760, 960, 1060, and 1160 respectively illustrated in FIGS. 3A, 3B, 6, 7A, 7B, 9, 10, and 11. The display device 1200 illustrated in FIG. 12 is substantially similar to the display device 100 illustrated in FIGS. 1 and 2, except that the diffusion plate 150 is removed, and a redundant description will be omitted.

With reference to FIG. 12, a backlight unit BLU of a display device 1200 may not include a diffusion plate 150, but may include only a plurality of optical sheets 140 and a plurality of light source packages, e.g., any of light source packages 160, 660, 760, 960, 1060, and 1160. A plurality of first diffuser layers 166 and a second diffuser layer, e.g., any of second diffuser layers 167, 967, and 1167, of the plurality of light source packages, e.g., any of light source packages 160, 660, 760, 960, 1060, and 1160, of the backlight unit BLU may perform a function as a diffusion plate 150.

Therefore, in the display device 1200 according to still another example embodiment of the present disclosure, the plurality of first diffuser layers 166 and the second diffuser layer, e.g., any of second diffuser layers 167, 967, and 1167, of the plurality of light source packages, e.g., any of light source packages 160, 660, 760, 960, 1060, and 1160, may serve as the diffusion plate 150, so that the diffusion plate 150 generally used in the backlight unit BLU may be removed or omitted. Therefore, the number of components may be reduced, and the thickness of the display device 1200 may be reduced. For example, the diffusion plate 150 may uniformly diffuse light emitted from the plurality of light source packages, e.g., any of light source packages 160, 660, 760, 960, 1060, and 1160, on the entire surface of the diffusion plate 150 to allow uniform light to be incident onto the plurality of optical sheets 140. For example, the diffusion plate 150 may function to diffuse the light emitted from the plurality of light source packages, e.g., any of light source packages 160, 660, 760, 960, 1060, and 1160, of the backlight unit BLU to implement a uniform surface light source. Further, the light source packages, e.g., any of light source packages 160, 660, 760, 960, 1060, and 1160, of the display device 1200 according to still another example embodiment of the present disclosure may include the plurality of first diffuser layers 166 and the second diffuser layer, e.g., any of second diffuser layers 167, 967, and 1167, which may diffuse the point-shaped light emitted from the plurality of light sources, e.g., any of the plurality of light sources 162, 762a, 762b, and 762c, to the entire surfaces of the light source packages, e.g., any of light source packages 160, 660, 760, 960, 1060, and 1160, to implement the surface-shaped light, and to improve the optical extraction efficiency toward the display panel 120. Therefore, in the display device 1200 according to still another example embodiment of the present disclosure, the plurality of first diffuser layers 166 and the second diffuser layer, e.g., any of second diffuser layers 167, 967, and 1167, of the plurality of light source packages, e.g., any of light source packages 160, 660, 760, 960, 1060, and 1160, of the backlight unit BLU may serve as the diffusion plate 150. Therefore, the diffusion plate 150 of the backlight unit BLU may be removed or omitted, e.g., to reduce the cost, and to implement a display device 1200 having a slim design.

A display apparatus according to an embodiment of the present disclosure will be described below.

According to an embodiment of the present disclosure, a light source package may include: a frame including a plurality of first grooves spaced apart from each other, a plurality of light sources, each in a respective one of the plurality of first grooves, a plurality of first diffuser layers respectively filling the plurality of first grooves and covering the plurality of light sources, and a second diffuser layer covering the plurality of first diffuser layers on the plurality of first grooves. An uppermost end of the frame may be higher than an upper surface of the second diffuser layer.

For example, the light source package according to an embodiment of the present disclosure may further include a plurality of beads in at least one of the plurality of first diffuser layers and the second diffuser layer. For example, in the light source package according to an embodiment of the present disclosure, the upper surface of the second diffuser layer may include a plurality of patterns. For example, in the light source package according to an embodiment of the present disclosure, a center portion of the upper surface of the second diffuser layer has a height equal to or smaller than an edge of the upper surface.

For example, the light source package according to an embodiment of the present disclosure may further include phosphors in at least one of the plurality of first diffuser layers and the second diffuser layer, and a combination of light emitted from the plurality of light sources and light emitted from the phosphors may be white light. For example, in the light source package according to an embodiment of the present disclosure, at least some of the plurality of light sources may be configured to emit different colored light, and a combination of light emitted from the plurality of light sources may be white light.

For example, in the light source package according to an embodiment of the present disclosure, the frame may include a protrusion between the plurality of first grooves and a second groove from an upper surface of the protrusion to the uppermost end of the frame, the second diffuser layer may fill the second groove, and an inner side of the second groove may be an inclined plane so that the second groove may have a largest area in the uppermost end of the frame.

For example, in the light source package according to an embodiment of the present disclosure, a height from a bottom surface of the first groove to the upper surface of the protrusion may be equal to or smaller than a height from the bottom surface of the first groove to a lower base of the inclined plane of the second groove.

According to an embodiment of the present disclosure, a backlight unit may include: a printed circuit board, and a plurality of surface light source packages mounted on the printed circuit board, each of the plurality of surface light source packages including: a plurality of point light sources, a frame including a plurality of first grooves in which the plurality of point light sources may be accommodated, a first sealant filling the plurality of first grooves, and a second sealant filling a second groove on the plurality of first grooves. A height from an upper surface of the printed circuit board to an upper surface of the second sealant may be smaller than a height from the upper surface of the printed circuit board to an uppermost end of the frame.

For example, in the backlight unit according to an embodiment of the present disclosure, each of the plurality of surface light source packages may further include a plurality of beads in at least one of the first sealant and the second sealant. For example, in the backlight unit according to an embodiment of the present disclosure, the upper surface of the second sealant may include a concave-convex structure.

For example, in the backlight unit according to an embodiment of the present disclosure, each of the plurality of point light sources in each of the plurality of surface light source packages may be configured to emit a same color light, and each of the plurality of surface light source packages may further include phosphors in at least one of the first sealant and the second sealant.

According to an embodiment of the present disclosure, a display device may include: a display panel, and a plurality of light source packages on a rear surface of the display panel, each of the plurality of light source packages including: a frame including a plurality of first grooves, a plurality of light sources respectively in the plurality of first grooves, a plurality of first diffuser layers respectively enclosing the plurality of light sources, and a second diffuser layer covering the plurality of first diffuser layers.

For example, in the display device according to an embodiment of the present disclosure, a surface of the second diffuser layer may be in the frame. For example, the display device according to an embodiment of the present disclosure may further include a plurality of beads in at least one of: the first diffuser layers and the second diffuser layer, and the plurality beads may be configured to change a path of light emitted from the plurality of light sources to be directed to the display panel.

For example, in the display device according to an embodiment of the present disclosure, a surface of the second diffuser layer may include a plurality of patterns, and each of the plurality of patterns may be configured to change a path of light emitted from the plurality of light sources to be directed to the display panel. For example, the display device according to an embodiment of the present disclosure may further include phosphors in at least one of the first diffuser layers and the second diffuser layer.

It will be apparent to those skilled in the art that various modifications and variations may be made in the present disclosure without departing from the technical idea or scope of the disclosure. Thus, it is intended that embodiments of the present disclosure cover the modifications and variations of the disclosure provided they come within the scope of the appended claims and their equivalents.

What is claimed is:

1. A light source package, comprising:
a frame comprising:
a plurality of first grooves spaced apart from each other; and
a second groove disposed on the plurality of first grooves;
a protrusion disposed between the plurality of first grooves;
a plurality of light sources, each in a respective one of the plurality of first grooves;
a plurality of first diffuser layers respectively filling the plurality of first grooves and covering the plurality of light sources; and
a second diffuser layer filling the second groove and covering the plurality of first diffuser layers on the plurality of first grooves and the protrusion,
wherein an uppermost end of the frame is higher than an upper surface of the second diffuser layer,
wherein the second groove is an opening area from top edge of the plurality of first grooves to the uppermost end of the frame, and
wherein the protrusion is integrally formed with the frame.

2. The light source package of claim 1, further comprising a plurality of beads in at least one of the plurality of first diffuser layers and the second diffuser layer.

3. The light source package of claim 1, wherein the upper surface of the second diffuser layer comprises a plurality of patterns.

4. The light source package of claim 1, wherein a center portion of the upper surface of the second diffuser layer has a height equal to or smaller than an edge of the upper surface.

5. The light source package of claim 4, wherein the upper surface of the second diffuser layer comprises a concave-convex structure.

6. The light source package of claim 1, further comprising:
phosphors in at least one of the plurality of first diffuser layers and the second diffuser layer,
wherein a combination of light emitted from the plurality of light sources and light emitted from the phosphors is white light.

7. The light source package of claim 1, wherein:
at least some of the plurality of light sources are configured to emit different colored light; and
a combination of light emitted from the plurality of light sources is white light.

8. The light source package of claim 1, wherein:
the frame comprises the second groove from an upper surface of the protrusion to the uppermost end of the frame;
an inner side of the second groove is an inclined plane so that the second groove has a largest area in the uppermost end of the frame and the upper surface of the second diffuser layer filling the second groove has the largest area.

9. The light source package of claim 8, wherein a height from a bottom surface of the first groove to the upper surface of the protrusion is equal to or smaller than a height from the bottom surface of the first groove to a lower base of the inclined plane of the second groove.

10. The light source package of claim 8, the second diffuser layer covers the plurality of first grooves.

11. The light source package of claim 8, wherein:
a side of the protrusion is in contact with a side of the plurality of first diffuser layers and
an upper surface of the protrusion is in contact with a bottom surface of the second diffuser layer.

12. The light source package of claim 1, wherein:
the plurality of light sources is configured to emit a same color light; and
the light source package further comprises a phosphor in at least one of the plurality of first diffuser layers and the second diffuser layer.

13. The light source package of claim 1, wherein the upper surface of the second diffuser layer is in the frame.

* * * * *